United States Patent
Kao

(10) Patent No.: US 9,537,040 B2
(45) Date of Patent: Jan. 3, 2017

(54) COMPLEMENTARY METAL-OXIDE-SEMICONDUCTOR IMAGE SENSOR AND MANUFACTURING METHOD THEREOF

(71) Applicant: UNITED MICROELECTRONICS CORP., Hsin-Chu (TW)

(72) Inventor: Ching-Hung Kao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 190 days.

(21) Appl. No.: 13/891,153

(22) Filed: May 9, 2013

(65) Prior Publication Data

US 2014/0332868 A1    Nov. 13, 2014

(51) Int. Cl.
*H01L 31/18* (2006.01)
*H01L 27/146* (2006.01)

(52) U.S. Cl.
CPC ..... *H01L 31/1804* (2013.01); *H01L 27/14609* (2013.01); *H01L 27/14643* (2013.01); *H01L 27/14689* (2013.01)

(58) Field of Classification Search
CPC ........... H01L 31/1804; H01L 27/14609; H01L 27/14643; H01L 21/823406; H01L 27/1057; H01L 27/14818; H01L 27/14831; H01L 27/14868; H01L 27/14875; H01L 27/14893; H01L 29/765; H01L 31/1122; H01L 31/1125; H01L 31/1128; H01L 27/1463; H01L 27/14636
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |

(Continued)

*Primary Examiner* — Steven Loke
*Assistant Examiner* — Juanita Rhodes
(74) *Attorney, Agent, or Firm* — Winston Hsu; Scott Margo

(57) ABSTRACT

A method for manufacturing semiconductor devices includes following steps. A substrate having a pixel region and a periphery region defined thereon is provided, and at least a transistor is formed in the pixel region. A blocking layer is formed on the substrate, and the blocking layer includes a first opening exposing a portion of the substrate in the pixel region and a second opening exposing a portion of the transistor. A first conductive body is formed in the first opening and a second conductive body is formed in the second opening, respectively. The first conductive body protrudes from the substrate and the second conductive body protrudes from the transistor. A portion of the blocking layer is removed. A first salicide layer is formed on the first conductive body and a second salicide layer is formed on the second conductive body, respectively.

8 Claims, 11 Drawing Sheets

(56) References Cited

U.S. PATENT DOCUMENTS

| | | | |
|---|---|---|---|
| 5,466,926 A | 11/1995 | Sasano | |
| 5,587,696 A | 12/1996 | Su | |
| 5,625,210 A | 4/1997 | Lee | |
| 5,650,864 A | 7/1997 | Tseng | |
| 5,830,624 A | 11/1998 | Bae | |
| 5,880,495 A | 3/1999 | Chen | |
| 5,977,535 A | 11/1999 | Rostoker | |
| 6,006,764 A | 12/1999 | Chu | |
| 6,071,826 A | 6/2000 | Cho | |
| 6,081,018 A | 6/2000 | Nakashiba | |
| 6,087,211 A | 7/2000 | Kalnitsky | |
| 6,124,200 A | 9/2000 | Wang | |
| 6,294,313 B1 | 9/2001 | Kobayashi | |
| 6,297,160 B1 | 10/2001 | Chien | |
| 6,338,976 B1 | 1/2002 | Huang | |
| 6,352,876 B1 | 3/2002 | Bordogna | |
| 6,369,417 B1 | 4/2002 | Lee | |
| 6,376,797 B1 | 4/2002 | Piwczyk | |
| 6,383,882 B1* | 5/2002 | Lee | H01L 21/28052 257/E21.199 |
| 6,388,278 B1 | 5/2002 | Suzuki | |
| 6,407,415 B2 | 6/2002 | Lee | |
| 6,433,844 B2 | 8/2002 | Li | |
| 6,482,669 B1 | 11/2002 | Fan | |
| 6,514,810 B1 | 2/2003 | Kim | |
| 6,566,151 B2 | 5/2003 | Yeh | |
| 6,617,189 B1 | 9/2003 | Chen | |
| 6,632,700 B1 | 10/2003 | Fan | |
| 6,641,464 B1 | 11/2003 | Steere, III | |
| 6,664,191 B1 | 12/2003 | Kim | |
| 6,730,555 B2 | 5/2004 | Kim | |
| 6,794,215 B2 | 9/2004 | Park | |
| 6,821,809 B2 | 11/2004 | Abe | |
| 6,841,848 B2 | 1/2005 | MacNamara | |
| 6,846,722 B2 | 1/2005 | Lee | |
| 6,849,533 B2 | 2/2005 | Chang | |
| 6,872,584 B2 | 3/2005 | Nakashiba | |
| 6,921,934 B2 | 7/2005 | Patrick | |
| 6,933,972 B2 | 8/2005 | Suzuki | |
| 6,953,608 B2 | 10/2005 | Leu | |
| 6,960,512 B2 | 11/2005 | Cheng | |
| 7,006,294 B2 | 2/2006 | Steenblik | |
| 7,078,779 B2 | 7/2006 | Wang | |
| 7,115,924 B1 | 10/2006 | LaMaster | |
| 7,129,172 B2 | 10/2006 | Morrow | |
| 7,180,044 B2 | 2/2007 | Yu | |
| 7,199,439 B2 | 4/2007 | Farnworth | |
| 7,229,745 B2 | 6/2007 | Lamarre | |
| 7,315,359 B2 | 1/2008 | Hong | |
| 7,328,915 B2 | 2/2008 | Smith | |
| 7,498,190 B2 | 3/2009 | Kao | |
| 7,648,851 B2 | 1/2010 | Fu | |
| 8,247,262 B2 | 8/2012 | Huang et al. | |
| 2001/0023086 A1 | 9/2001 | Park | |
| 2004/0122328 A1 | 6/2004 | Wang | |
| 2005/0024520 A1 | 2/2005 | Yamamoto | |
| 2005/0103983 A1 | 5/2005 | Yamaguchi | |
| 2005/0121599 A1 | 6/2005 | Mouli | |
| 2005/0186739 A1 | 8/2005 | Wang | |
| 2005/0247963 A1 | 11/2005 | Chen | |
| 2005/0274988 A1 | 12/2005 | Hong | |
| 2005/0274996 A1 | 12/2005 | Iwawaki | |
| 2006/0054946 A1 | 3/2006 | Baek | |
| 2006/0124833 A1 | 6/2006 | Toda | |
| 2006/0146230 A1 | 7/2006 | Joon | |
| 2006/0146412 A1 | 7/2006 | Kim | |
| 2006/0172451 A1 | 8/2006 | Park | |
| 2006/0183265 A1 | 8/2006 | Oh | |
| 2006/0231898 A1 | 10/2006 | Jeong | |
| 2007/0010042 A1 | 1/2007 | Li | |
| 2007/0012970 A1 | 1/2007 | Mouli | |
| 2007/0018073 A1 | 1/2007 | Hsu | |
| 2007/0023851 A1 | 2/2007 | Hartzell | |
| 2007/0031988 A1 | 2/2007 | Agranov | |
| 2007/0052050 A1 | 3/2007 | Dierickx | |
| 2007/0072326 A1 | 3/2007 | Zheng | |
| 2007/0096173 A1 | 5/2007 | Kim | |
| 2007/0117253 A1 | 5/2007 | Hsu | |
| 2007/0158772 A1 | 7/2007 | Boettiger | |
| 2007/0166649 A1 | 7/2007 | Yu | |
| 2007/0202696 A1 | 8/2007 | Inuiya | |
| 2008/0035964 A1* | 2/2008 | Lee | H01L 27/14689 257/291 |
| 2008/0036020 A1 | 2/2008 | Ko | |
| 2008/0055733 A1 | 3/2008 | Lim | |
| 2008/0079103 A1 | 4/2008 | Liao | |
| 2008/0121805 A1 | 5/2008 | Tweet | |
| 2008/0121951 A1* | 5/2008 | Kao | H01L 27/14689 257/291 |
| 2008/0157144 A1 | 7/2008 | Lee | |
| 2008/0169546 A1 | 7/2008 | Kwon | |
| 2008/0265348 A1 | 10/2008 | Maas | |
| 2009/0066954 A1 | 3/2009 | Opsal | |
| 2009/0121264 A1 | 5/2009 | Kao | |
| 2009/0124037 A1 | 5/2009 | Yu | |
| 2009/0127643 A1 | 5/2009 | Lu | |
| 2009/0134484 A1 | 5/2009 | Lin | |
| 2009/0168181 A1 | 7/2009 | Su | |
| 2009/0200585 A1 | 8/2009 | Nozaki | |
| 2009/0212335 A1 | 8/2009 | Kao | |
| 2009/0256258 A1 | 10/2009 | Kreupl | |
| 2009/0294888 A1 | 12/2009 | Tsai | |
| 2009/0321862 A1 | 12/2009 | Yu | |
| 2010/0003623 A1 | 1/2010 | Liu | |
| 2010/0038688 A1 | 2/2010 | Wu | |
| 2010/0044813 A1 | 2/2010 | Wu | |
| 2010/0052052 A1* | 3/2010 | Lotfi | H01L 21/28518 257/336 |
| 2010/0096359 A1 | 4/2010 | Shiu | |
| 2010/0144156 A1 | 6/2010 | Shih | |
| 2010/0159632 A1 | 6/2010 | Rhodes | |
| 2010/0279459 A1* | 11/2010 | Huang | H01L 27/14689 438/98 |
| 2010/0315734 A1 | 12/2010 | Wu | |
| 2011/0057277 A1 | 3/2011 | Yu | |
| 2011/0159632 A1* | 6/2011 | Sueyoshi | C23C 16/345 438/72 |
| 2012/0181581 A1* | 7/2012 | Hynecek | H01L 27/1464 257/222 |
| 2013/0070508 A1* | 3/2013 | Fukuzumi | G11C 5/02 365/63 |

* cited by examiner

COMPLEMENTARY METAL-OXIDE-SEMICONDUCTOR IMAGE SENSOR AND MANUFACTURING METHOD THEREOF

BACKGROUND OF THE INVENTION

1. Field of the Invention

The present invention relates to a semiconductor device and a manufacturing method thereof, and more particularly, to the semiconductor device and the manufacturing method thereof for a complementary metal oxide semiconductor (herein abbreviated as CMOS) image sensor.

2. Description of the Prior Art

As the development of electronic products such as digital cameras and scanners progresses, the demand for image sensors increases accordingly. In general, image sensors in common usage nowadays are divided into two main categories: charge coupled device (CCD) sensors and CMOS image sensors (CIS). Primarily, CMOS image sensors have certain advantages of low operating voltage, low power consumption, and ability for random access. Furthermore, CMOS image sensors are currently capable of integration with the semiconductor fabrication process. Based on those benefits, the application of CMOS image sensors has increased significantly.

The CMOS image sensor separates incident light into a combination of light of different wavelengths. For example, the CMOS image sensor can consider incident light as a combination of red, blue, and green light. The light of different wavelengths is received by respective photosensitive elements such as photodiodes disposed in the substrate and is subsequently transformed into digital signals of different intensities. Thus, it is conceivable, that the substrate, particularly at where the photosensitive elements (that is the pixel region) are formed, should be protected from any contamination. For example, in order to prevent metal contamination, salicides are avoided from forming in the pixel region in the prior art. However, it results that the pixel region suffers high contact resistances and signal transmission is adversely impacted.

Therefore, semiconductor devices and manufacturing method for reducing resistance in the pixel region without causing metal contamination is still in need.

SUMMARY OF THE INVENTION

According to an aspect of the present invention, a manufacturing method of a semiconductor device is provided. The manufacturing method includes following steps: A substrate having a pixel region and a periphery region defined thereon is provided. At least a transistor is formed in the pixel region. Next, a blocking layer is formed on the substrate and followed by forming a first opening and a second opening in the blocking layer. The first opening exposes a portion of the substrate in the pixel region, and the second opening exposes a portion of the transistor. Then, a first conductive body is formed in the first opening and a second conductive body is formed in the second opening, respectively. The first conductive body protrudes from the substrate and the second conductive body protrudes from the transistor. After forming the first conductive body and the second conductive body, a portion of the blocking layer is removed. A first salicide layer is formed on the first conductive body and a second salicide layer is formed on the second conductive body, respectively.

According to another aspect of the present invention, a CMOS image sensor is provided. The CMOS image sensor includes a substrate, a first conductive body, and a first salicide layer. The substrate includes a pixel region defined thereon, the first conductive body is positioned on the substrate in the pixel region, and the first salicide layer is formed on the first conductive body. A top surface of the first conductive body is higher than a surface of the substrate. The first salicide layer comprises a cap shape from a cross-sectional view.

According to the manufacturing method of the semiconductor device provide by the present invention, the conductive bodies having a top surface higher than the substrate are formed in the pixel region, and the salicide layers are formed on the conductive bodies. Therefore, the salicide layer is formed away from the substrate, which includes the photosensitive elements. Consequently, metal contamination is avoided in the pixel region. More important, since salicide layers are allowed in the pixel region, contact resistances in the pixel region is efficaciously reduced and thus signal transmission is improved. Briefly speaking, the manufacturing method of semiconductor devices provided by the present invention is to form salicide layer, which is able to improve electrical performance of the CMOS image sensor, in the pixel region without causing metal contamination in the photosensitive element and increasing process complexity.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a semiconductor device provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIGS. 8-11 are schematic drawings illustrating a manufacturing method of a semiconductor device provided by a second preferred embodiment of the present invention, wherein FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

DETAILED DESCRIPTION

Figure 1:
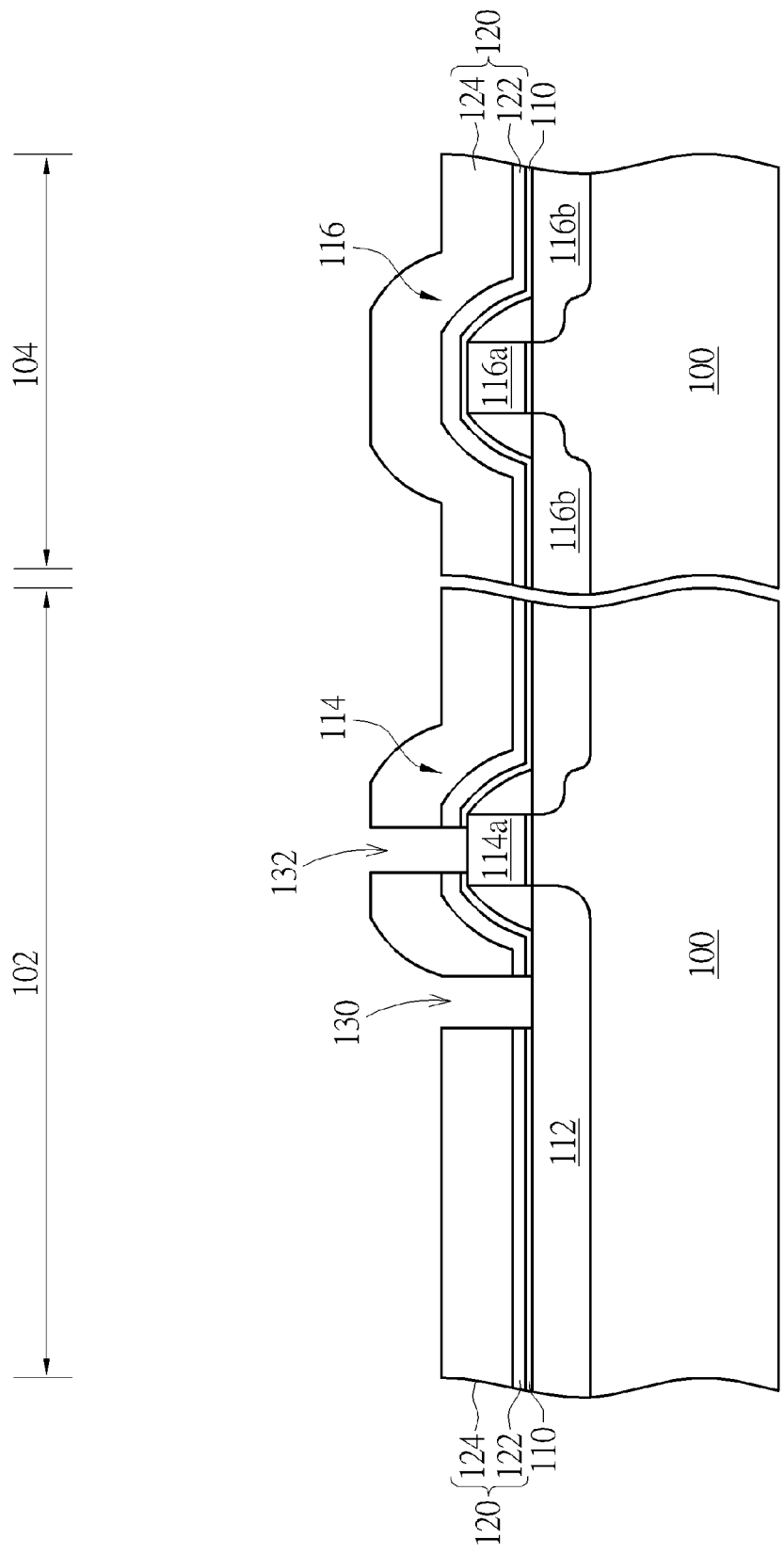

Please refer to FIGS. 1-7, which are schematic drawings illustrating a manufacturing method of a semiconductor device provided by a first preferred embodiment of the present invention. As shown in FIG. 1, a substrate 100 is provided. The substrate 100 can be a silicon substrate or other suitable semiconductor substrate. A plurality of isolation structures such as shallow trench isolations (not shown) is formed in the substrate 100 for defining a pixel region 102 and a periphery region 104 on the substrate 100. A plurality of photosensitive elements 112 and at least a first transistor 114 are formed in the pixel region 102. Logic elements are formed in the periphery region 104. For example but not limited to, at least a second transistor 116 is formed in the periphery region 104.

Please refer to FIG. 1 again. Next, a protecting layer 110 and a blocking layer 120 are sequentially formed on the substrate 100. In the preferred embodiment, the protecting layer 110 is an optional layer and can include, for example but not limited to, a silicon oxide layer. The blocking layer 120 is a multi-layer. For example, the blocking layer 120 is a bi-layer in the preferred embodiment. As shown in FIG. 1, the blocking layer 120 includes a salicide block (hereinafter abbreviated as SAB) layer 122 and a silicon oxide layer 124. Generally, the SAB layer 122 includes silicon nitride. However, those skilled in the art would easily realize that the SAB layer 122 can include any suitable material having etching rate different from the protecting layer 110 and/or the silicon oxide layer 124. Furthermore, the silicon oxide layer 124 includes a thickness, and the thickness is between 500-1500 angstroms (Å) according to the preferred embodiment.

Please still refer to FIG. 1. Then, a photolithography process is performed to form a first opening 130 and a second opening 132 in the blocking layer 120 and the protecting layer 110. It is noteworthy that the first opening 130 exposes a portion of the substrate 100 in the pixel region 102. In the preferred embodiment, the first opening 130 is formed to expose a portion of the photosensitive element 112, but not limited to this. The second opening 132 exposes a portion of the first transistor 114, particularly a gate electrode 114a of the first transistor 114.

Figure 2:
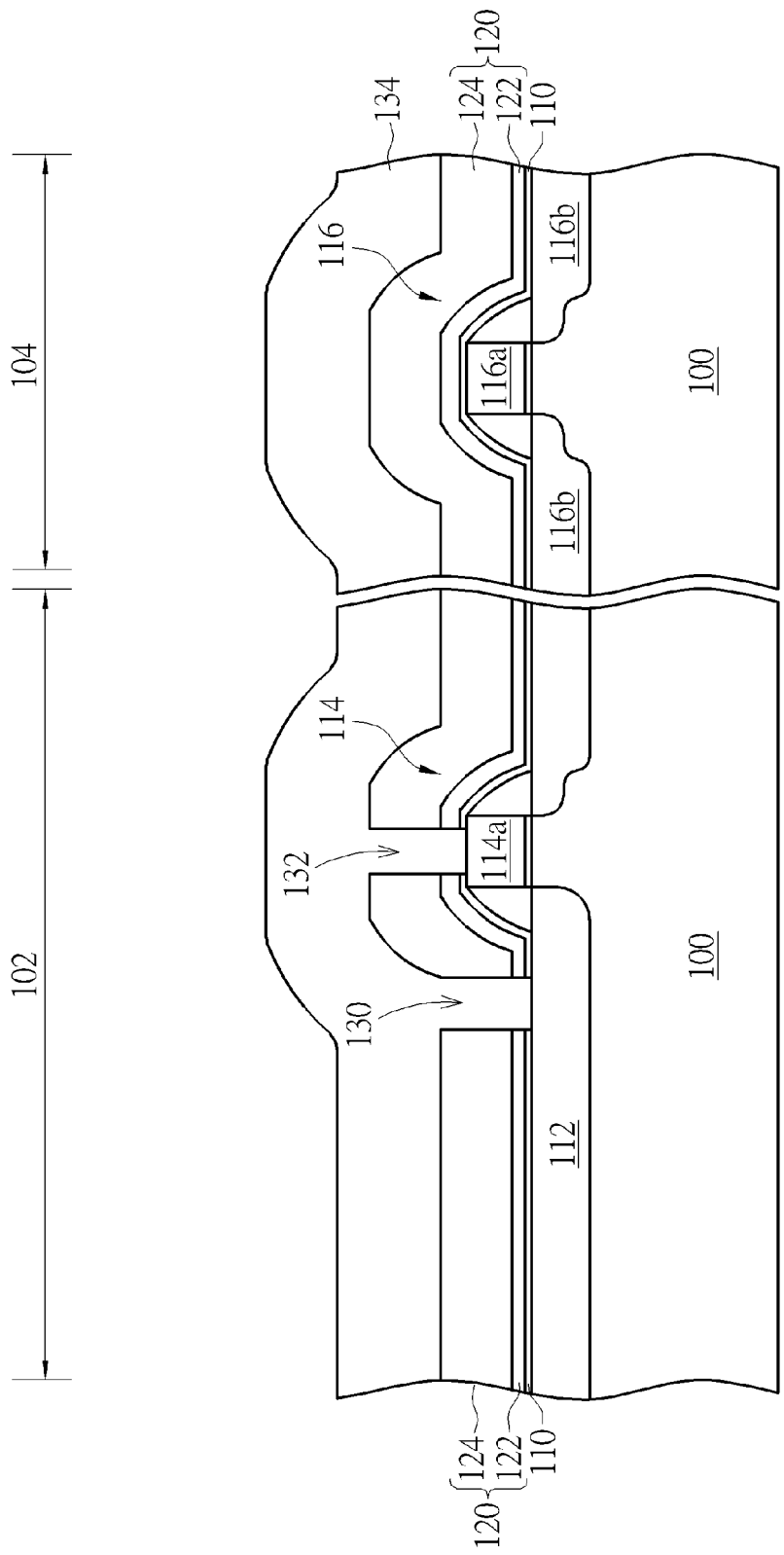

Please refer to FIG. 2. After forming the first opening 130 and the second opening 132, a conductive material layer 134 is formed on the blocking layer 120. In the preferred embodiment, the conductive material layer 134 and the gate electrode 114a can include the same material such as a polysilicon. It is noteworthy that the conductive material layer 134 fills up the first opening 130 and the second opening 132 as shown in FIG. 2.

Figure 3:
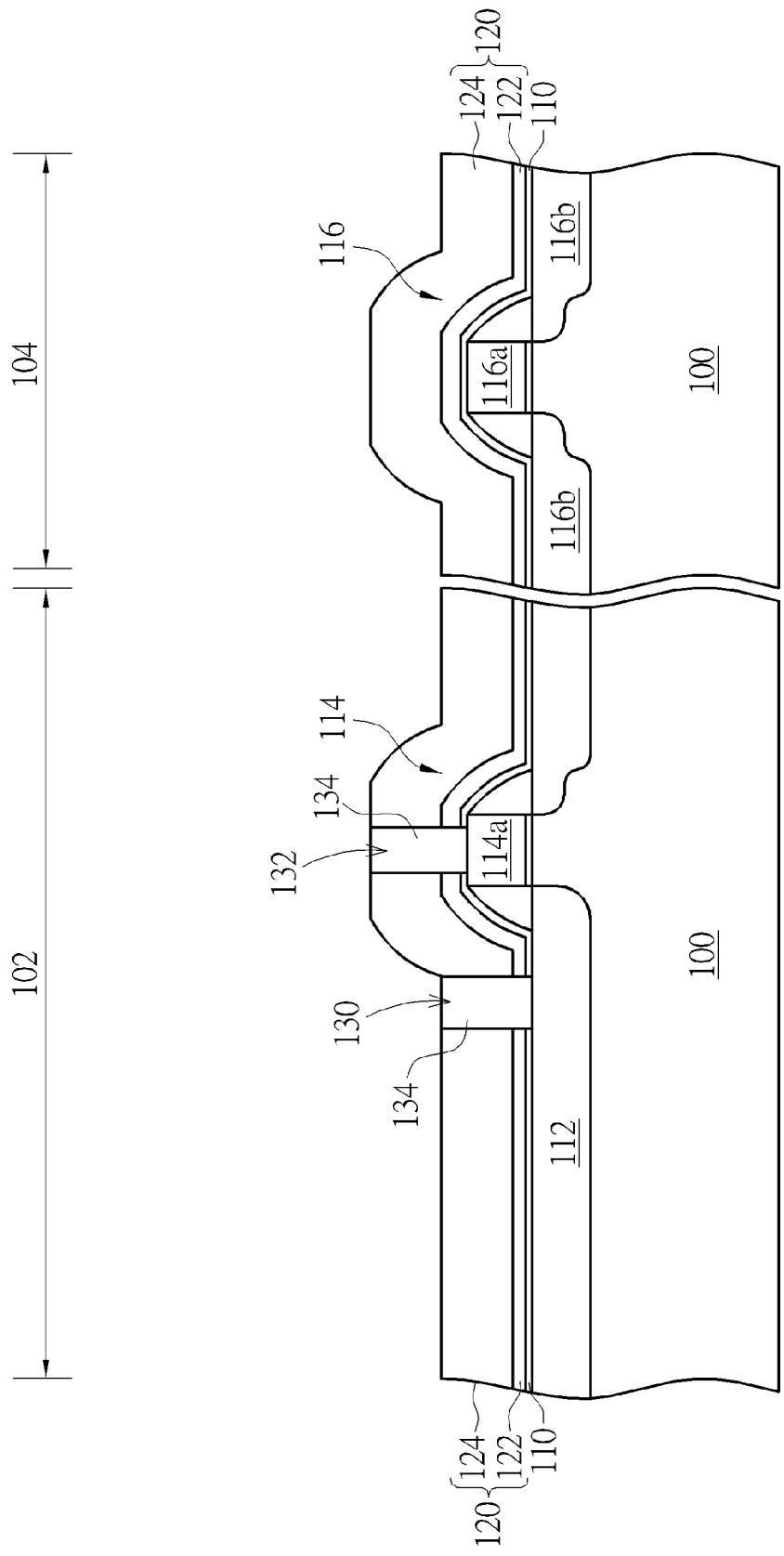

Please refer to FIG. 3. After forming the conductive material layer 134, an etching back process is performed to the conductive material layer 134. The etching back process includes any suitable method such as wet etching or dry etching. As shown in FIG. 3, all the conductive material layer 134 on the top surface of the blocking layer 120 are removed from. Consequently, the conductive material layer 134 remains only in the first opening 130 and the second opening 132.

Figure 4:
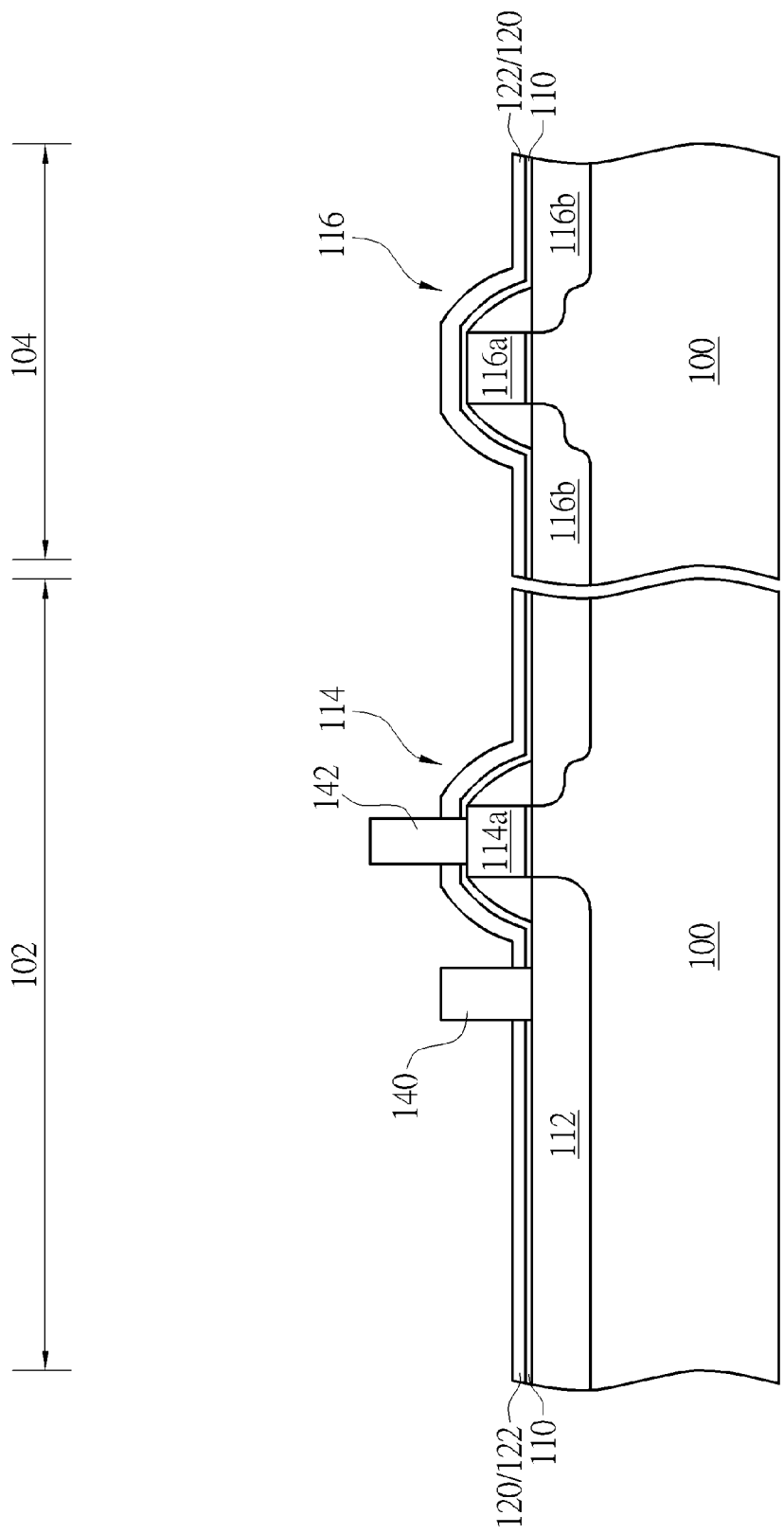

Please refer to FIG. 4. After the etching back process, the silicon oxide layer 124 of the blocking layer 120 is removed by another etching process. Thus, a first conductive body 140 is formed in the first opening 130 and a second conductive body 142 is formed in second opening 132, respectively. As shown in FIG. 4, the first conductive body 140 protrudes from the surface of the substrate 100, particularly from a surface of the photosensitive element 112. The second conductive body 142 protrudes from the gate electrode 114a of the first transistor 114. In other words, a top surface of the first conductive body 140 is higher than the surface of the substrate 100, and a top surface of the second conductive body 142 is higher than a top surface of the gate electrode 114a. Additionally, since the first conductive body 140, the second conductive body 142, and the gate electrode 114a, even the substrate 100, include the same material, the first conductive body 140 and the second conductive body 142 are formed without impacting electrical performance of the first transistor 114 and the photosensitive element 112. It is noteworthy that since the first conductive body 140 and the second conductive body 142 are formed by filling the first opening 130 and the second opening 132, the thickness of the blocking layer 120, particularly the thickness of the silicon oxide layer 124 decides the height of first conductive body 140 and the second conductive body 142. In other words, the height of the first conductive body 140 and the second conductive body 142 is between 500-1500 Å.

Figure 5:
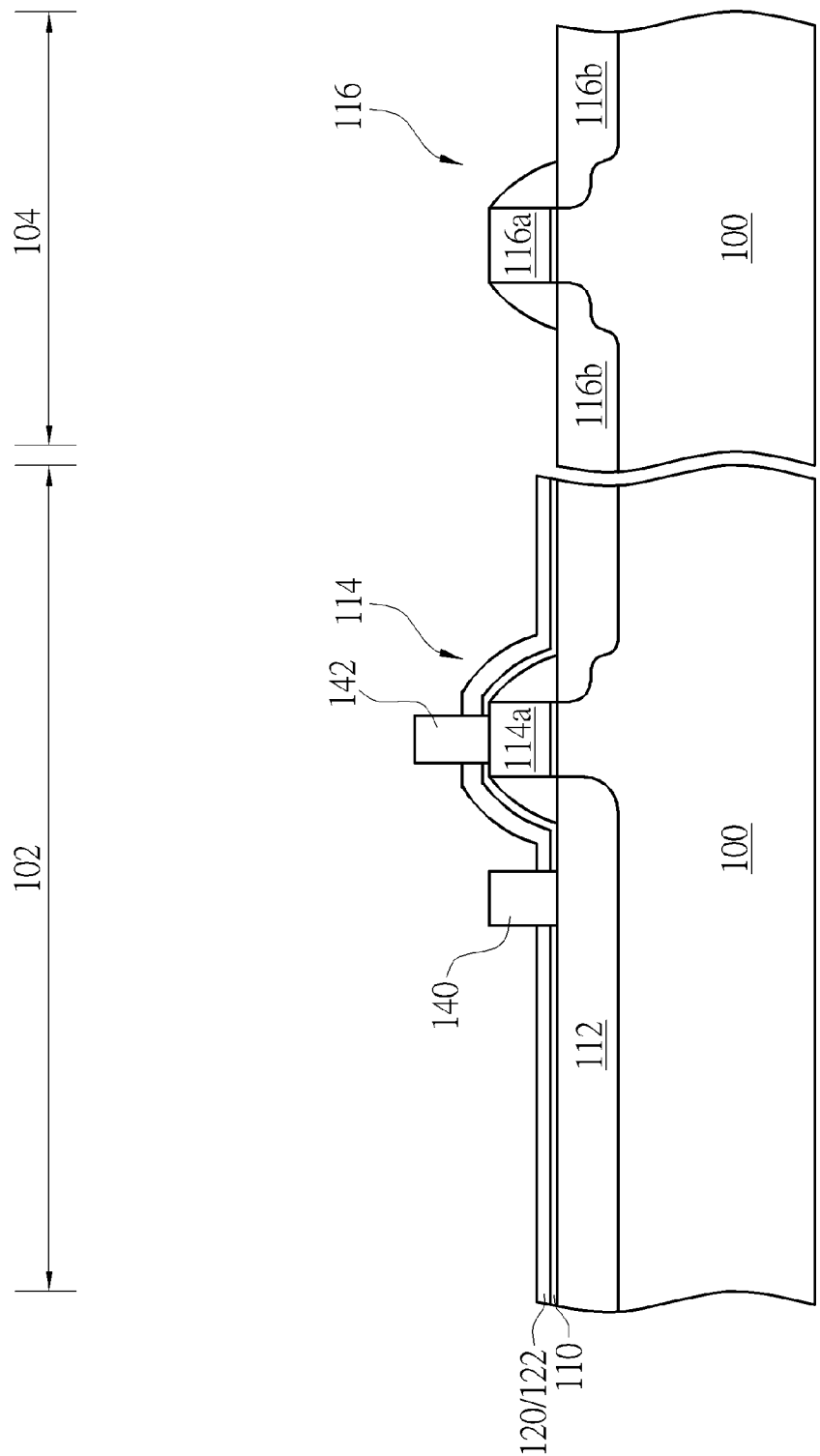

Please refer to FIG. 5. After forming the first conductive body 140 and the second conductive body 142, a portion of the blocking layer 120/122 and a portion of the protecting layer 110 are removed. In detail, the portion of the blocking layer 120/122 and the portion of the protecting layer 110 are removed from the periphery region 104. Therefore a gate electrode 116a and a source/drain 116b of the second transistor 116 in the periphery region 104 are exposed. It is noteworthy that the substrate 100 in the pixel region 102 is still covered and protected by the protecting layer 110 and the blocking layer 120/122.

Figure 6:
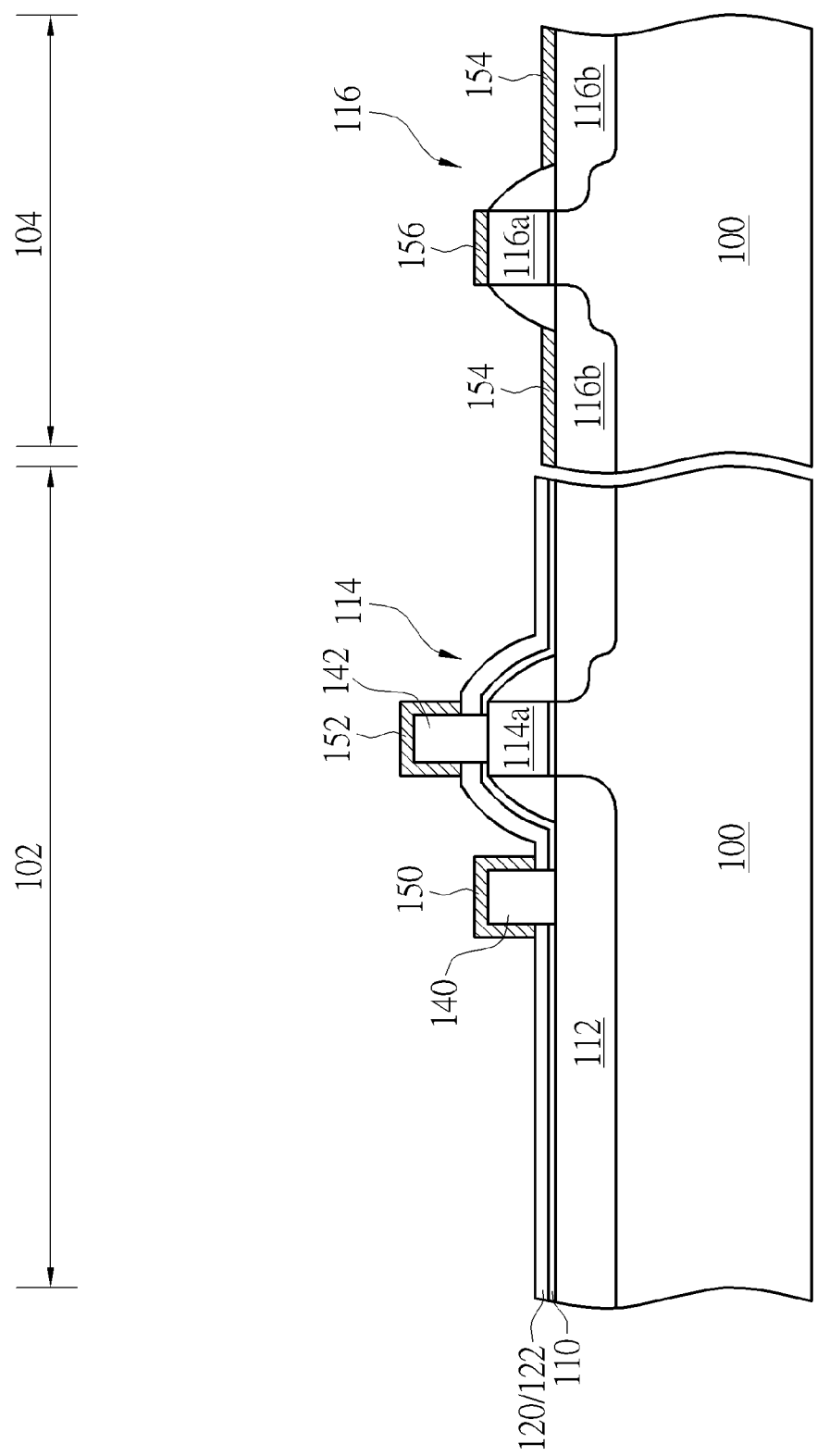

Please refer to FIG. 6. After removing the blocking layer 120/122 and the protecting layer 110 from the periphery region 104, a self-aligned silicide (salicide) process is performed to form a first salicide layer 150 on the first conductive body 140 and a second salicide layer 152 on the second conductive body 142 in the pixel region 102, and simultaneously to form a third salicide layer 154 on the source/drain 116b and a fourth salicide layer 156 on the gate electrode 116a in the periphery region 104. It is noteworthy that because metal only reacts with the exposed silicon material in the salicide process, the first salicide layer 150 and the second salicide layer 152 formed on the first conductive body 140 and the second conductive body 142 in the pixel region 102 include a cap shape from a cross-sectional view, respectively. For example, the first salicide layer 150 and the second salicide layer 152 may include an intersection mark (∩) cap shape (hereinafter described as ∩-cap shape) from the cross-sectional view. And the third salicide layer 154 and the fourth salicide layer 156 formed on the source/drain 116b and the gate electrode 116a in the periphery region 104 include a flat shape. In other words, the first salicide layer 150 and the second salicide layer 152 in the pixel region 102 include the shape different from the third salicide layer 154 and the fourth salicide layer 156 in the periphery region 104.

More important, the first salicide layer 150, the second salicide layer 152, the third salicide layer 154, and the fourth salicide layer 156 are all non-coplanar. As shown in FIG. 6, because the first salicide layer 150 and the second salicide layer 152 are formed on the first conductive body 140 and the second conductive body 142, which protrude from the substrate 100 and the gate electrode 114a, a topmost surface of the first salicide layer 150 is higher than a surface of the third salicide layer 154, and a topmost surface of the second salicide layer 152 is higher than a surface of the fourth salicide layer 156.

Figure 7:
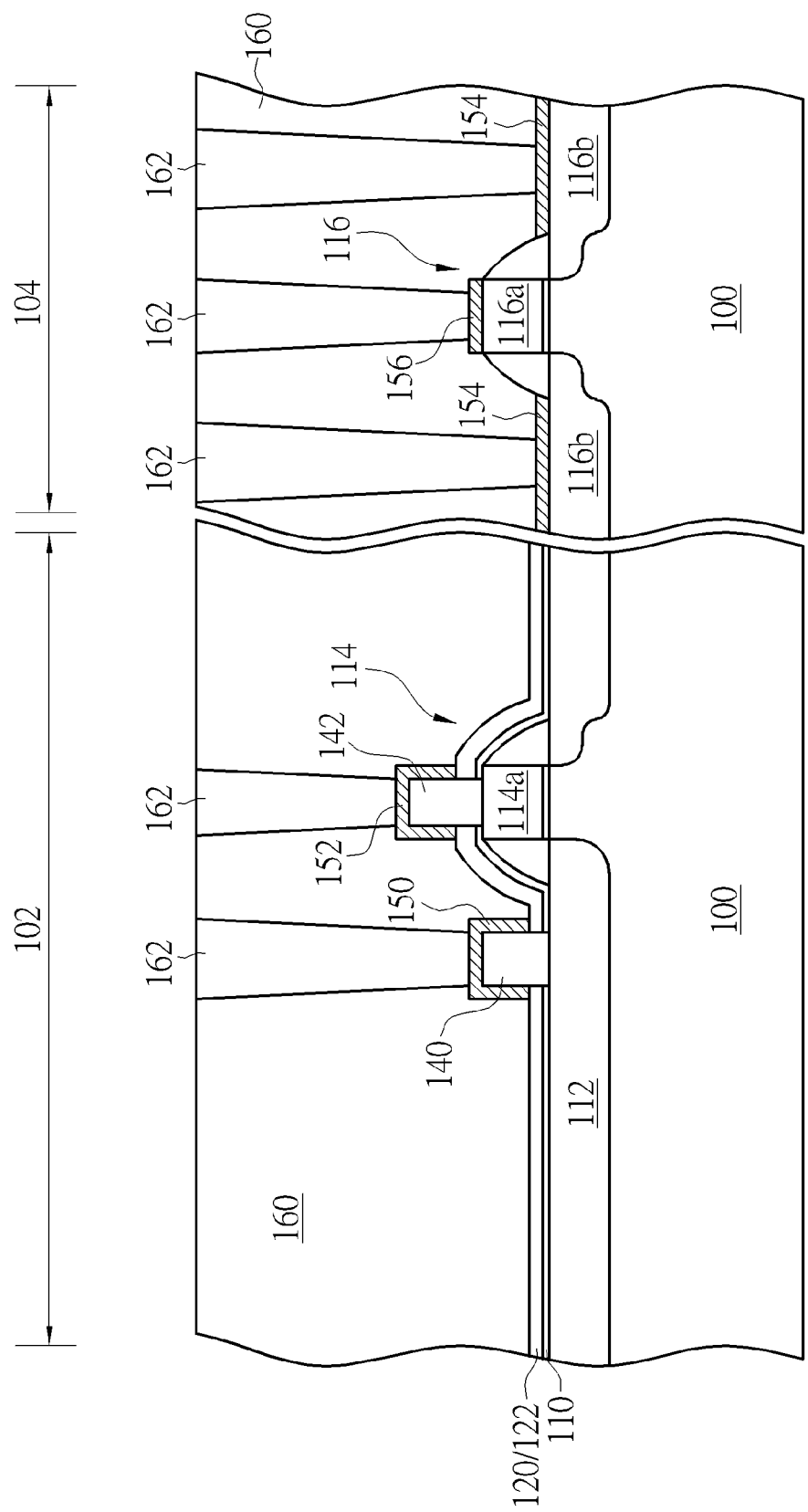

Please refer to FIG. 7. After forming the first salicide layer 150, the second salicide layer 152, the third salicide layer 154, and the fourth salicide layer 156, an inter layer dielectric (hereinafter abbreviated as ILD) layer 160 is formed on the substrate 100 and followed by forming a plurality of contact plugs 162 in the ILD layer 160. As shown in FIG. 7, the contact plugs 162 are electrically connected to the first salicide layer 150, the second salicide layer 152, the third salicide layer 154, and the fourth salicide layer 156 for providing signal transmission.

According to the semiconductor device and the manufacturing method provided by the preferred embodiment, the first conductive body 140 and the second conductive body 142 having the surface respectively higher than the substrate 100 and the gate electrode 114a are formed in the pixel region 102 and thus the first salicide layer 150 and the second salicide layer 152 formed on the first conductive body 140 and the second conductive body 142 are away from and not directly contact the substrate 100, particularly from the photosensitive element 112. Consequently, metal contamination in the pixel region 102 is efficaciously avoided in the salicide process. More important, since the first salicide layer 150 and the second salicide layer 152 are allowed in the pixel region 102, contact resistances in the pixel region 102 is efficaciously reduced and thus signal transmission is improved. Additionally, because the first salicide layer 150, the second salicide layer 152, the third salicide layer 154, and the fourth salicide layer 156 are simultaneously formed, the preferred embodiment further provides the manufacturing method without increasing process complexity and process difficulty.

Figure 8:
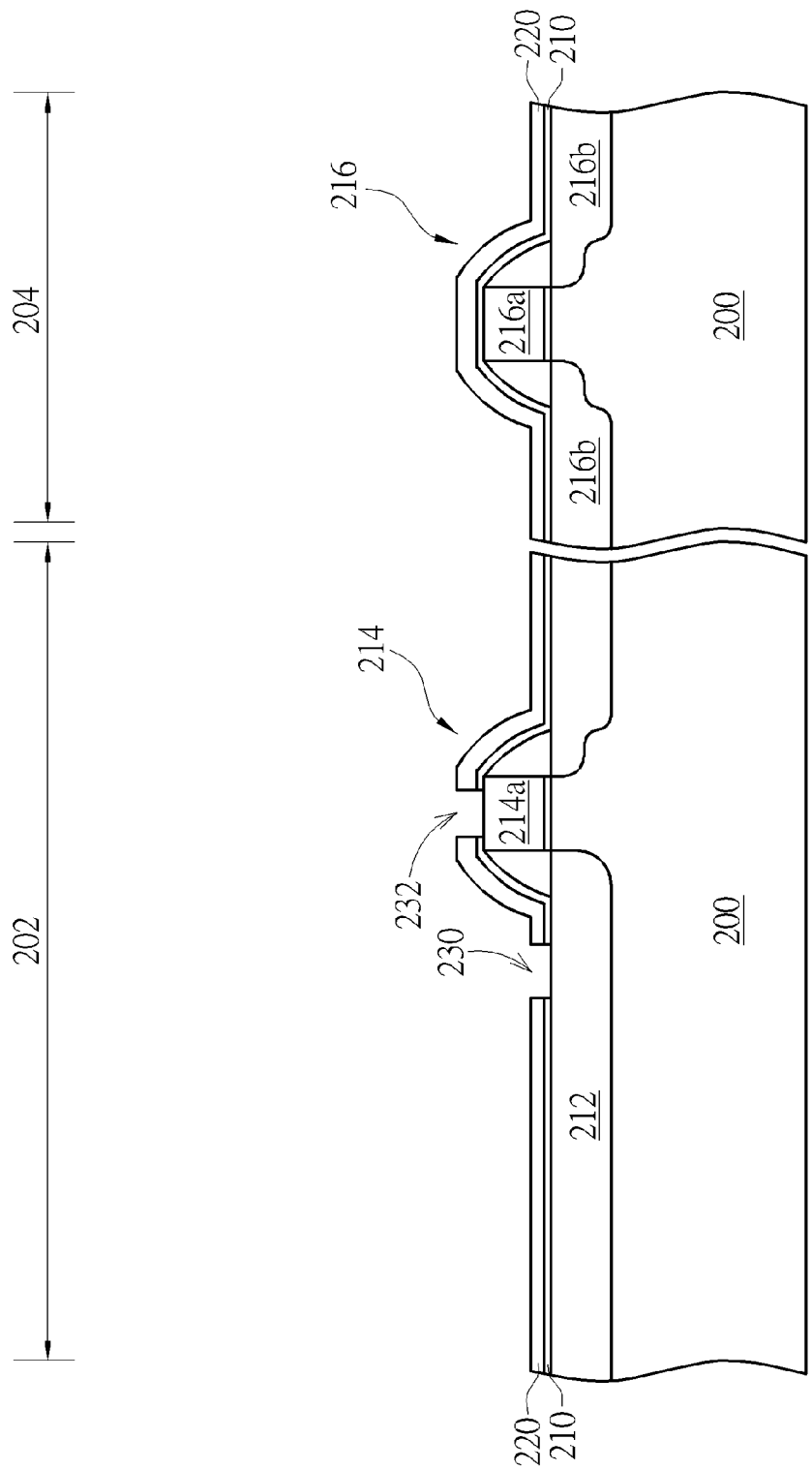

Please refer to FIGS. 8-11, which are schematic drawings illustrating a manufacturing method of a semiconductor device provided by a second preferred embodiment of the present invention. As shown in FIG. 8, a substrate 200 is provided. The substrate 200 can be a silicon substrate or other suitable semiconductor substrate. A plurality of isolation structures such as shallow trench isolations (not shown) is formed in the substrate 200 for defining a pixel region 202 and a periphery region 204 on the substrate 200. A plurality of photosensitive elements 212 and at least a first transistor 214 are formed in the pixel region 202. Logic elements are formed in the periphery region 204. For example but not limited to, at least a second transistor 216 is formed in the periphery region 204.

Please refer to FIG. 8 again. Next, a protecting layer 210 and a blocking layer 220 are sequentially formed on the substrate 200. As mentioned above, the protecting layer 210 is an optional layer and can include, for example but not limited to, a silicon oxide layer. The blocking layer 220 is a single layer in the preferred embodiment. As shown in FIG. 8, the blocking layer 220 includes a SAB layer. Generally, the SAB layer 220 includes silicon nitride. However, those skilled in the art would easily realize that the SAB layer 220 can include any suitable material having etching rate different from the protecting layer 210.

Please still refer to FIG. 8. Then, a photolithography process is performed to form a first opening 230 and a second opening 232 in the blocking layer 220 and the protecting layer 210. It is noteworthy that the first opening 230 exposes a portion of the substrate 200 in the pixel region 202. In the preferred embodiment, the first opening 230 is formed to expose a portion of the photosensitive element 212, but not limited to this. The second opening 232 exposes a portion of the first transistor 214, particularly a gate electrode 214a of the first transistor 214.

Figure 9:
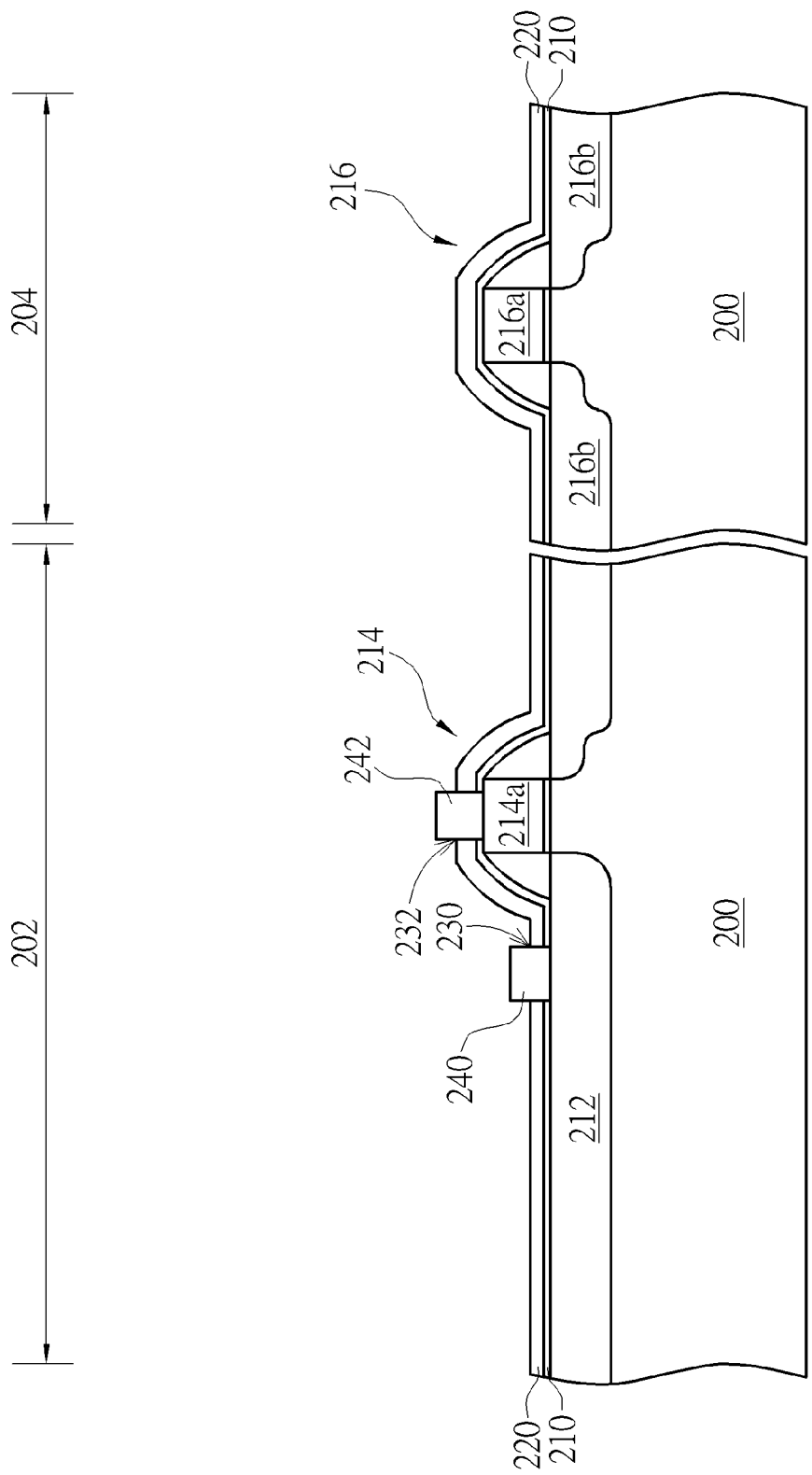

Please refer to FIG. 9. After forming the first opening 230 and the second opening 232, a selective epitaxial growth (hereinafter abbreviated as SEG) process is performed to form a first conductive body 240 in the first opening 230 and a second conductive body 242 in the second opening 232, respectively. Because the process characteristics of the SEG process, the first conductive body 240 and the second conductive body 242 are only grown from the silicon material exposed in the first opening 230 and the second opening 232. Furthermore, by adjusting process parameters of the SEG process, a height of the first conductive body 240 and the second conductive body 242 can be higher than a depth of the first opening 230 and the second opening 232. Therefore, the first conductive body 240 and the second conductive body 242 both protrude from a surface of the blocking layer 220 according to the preferred embodiment. Additionally, since the first conductive body 240 and the second conductive body 242 are formed by performing the SEG process, the first conductive body 240 and the second conductive body 242 may include material different from the substrate 200 and the gate electrode 214a. For example but not limited to, the first conductive body 240 and the second conductive body 242 can include epitaxial SiGe or SiC.

Figure 10:
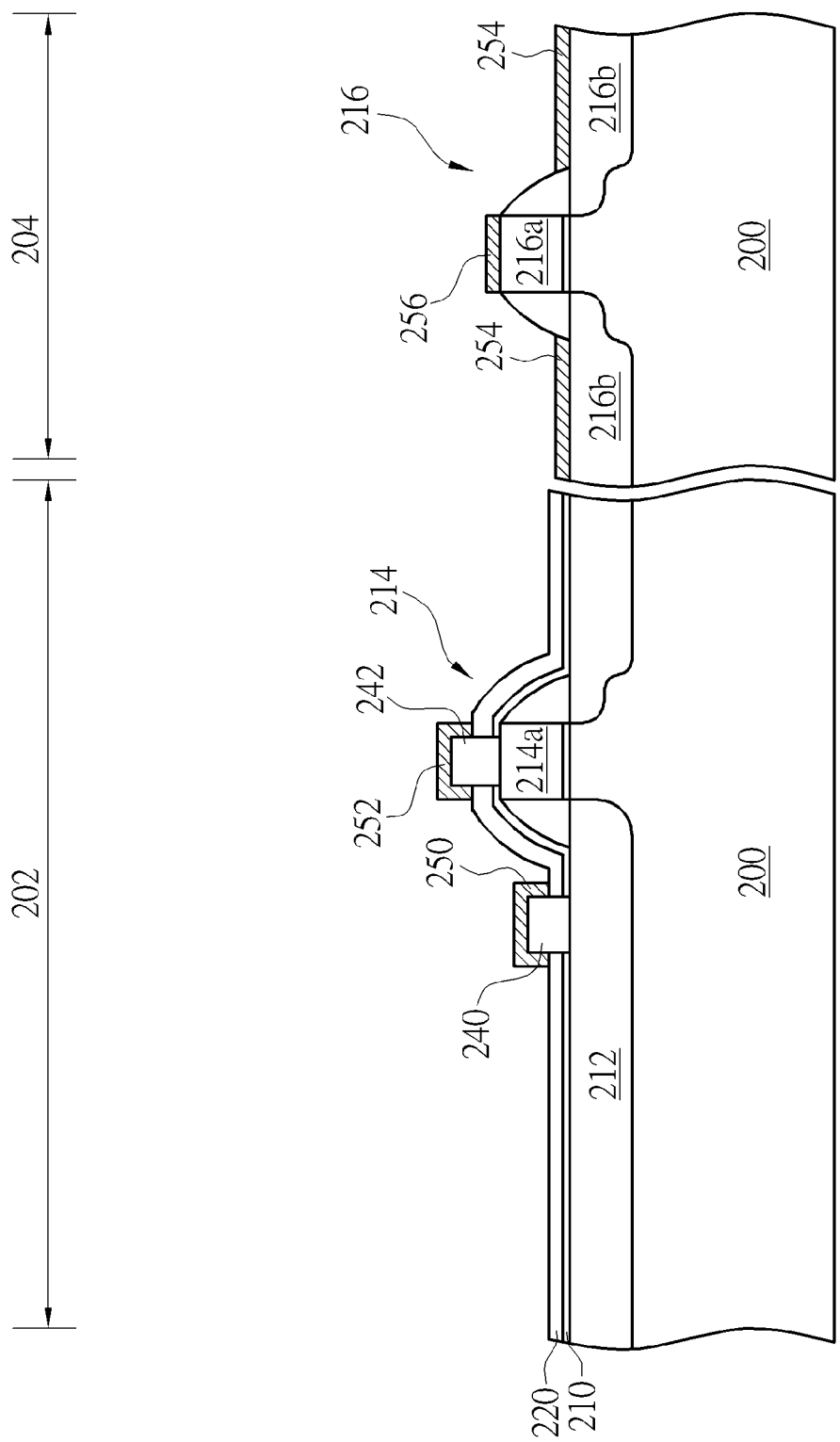

Please refer to FIG. 10. After forming the first conductive body 240 and the second conductive body 242, a portion of the blocking layer 220 and a portion of the protecting layer 210 are removed. In detail, the portion of the blocking layer 220 and the portion of the protecting layer 210 are removed from the periphery region 204. Therefore a gate electrode 216a and a source/drain 216b of the second transistor 216 in the periphery region 204 are exposed. It is noteworthy that the substrate 200 in the pixel region 202 is still covered and protected by the protecting layer 210 and the blocking layer 220.

Please still refer to FIG. 10. After removing the blocking layer 220 and the protecting layer 210 from the periphery region 204, a salicide process is performed to form a first salicide layer 250 on the first conductive body 240 and a second salicide layer 252 on the second conductive body 242 in the pixel region 202, and simultaneously to form a third salicide layer 254 on the source/drain 216b and a fourth salicide layer 256 on the gate electrode 216a in the periphery region 204. It is noteworthy that because metal only reacts with the exposed silicon material in the salicide process, the first salicide layer 250 and the second salicide layer 252 formed on the first conductive body 240 and the second conductive body 242 in the pixel region 202 include a cap shape from a cross-sectional view, respectively. For example, the first salicide layer 250 and the second salicide layer 252 can include an ∩-cap shape from the cross-sectional view. And the third salicide layer 254 and the fourth salicide layer 256 formed on the source/drain 216b and the gate electrode 216a in the periphery region 204 include a flat shape. In other words, the first salicide layer 250 and the second salicide layer 252 in the pixel region 202 include the shape different from the third salicide layer 254 and the fourth salicide layer 256 in the periphery region 204.

More important, the first salicide layer 250, the second salicide layer 252, the third salicide layer 254, and the fourth salicide layer 256 are all non-coplanar. As shown in FIG. 10, because the first salicide layer 250 and the second salicide layer 252 are formed on the first conductive body 240 and the second conductive body 242, which protrude from the substrate 200 and the gate electrode 214a, a topmost surface of the first salicide layer 250 is higher than a surface of the third salicide layer 254, and a topmost surface of the second salicide layer 252 is higher than a surface of the fourth salicide layer 256.

Figure 11:
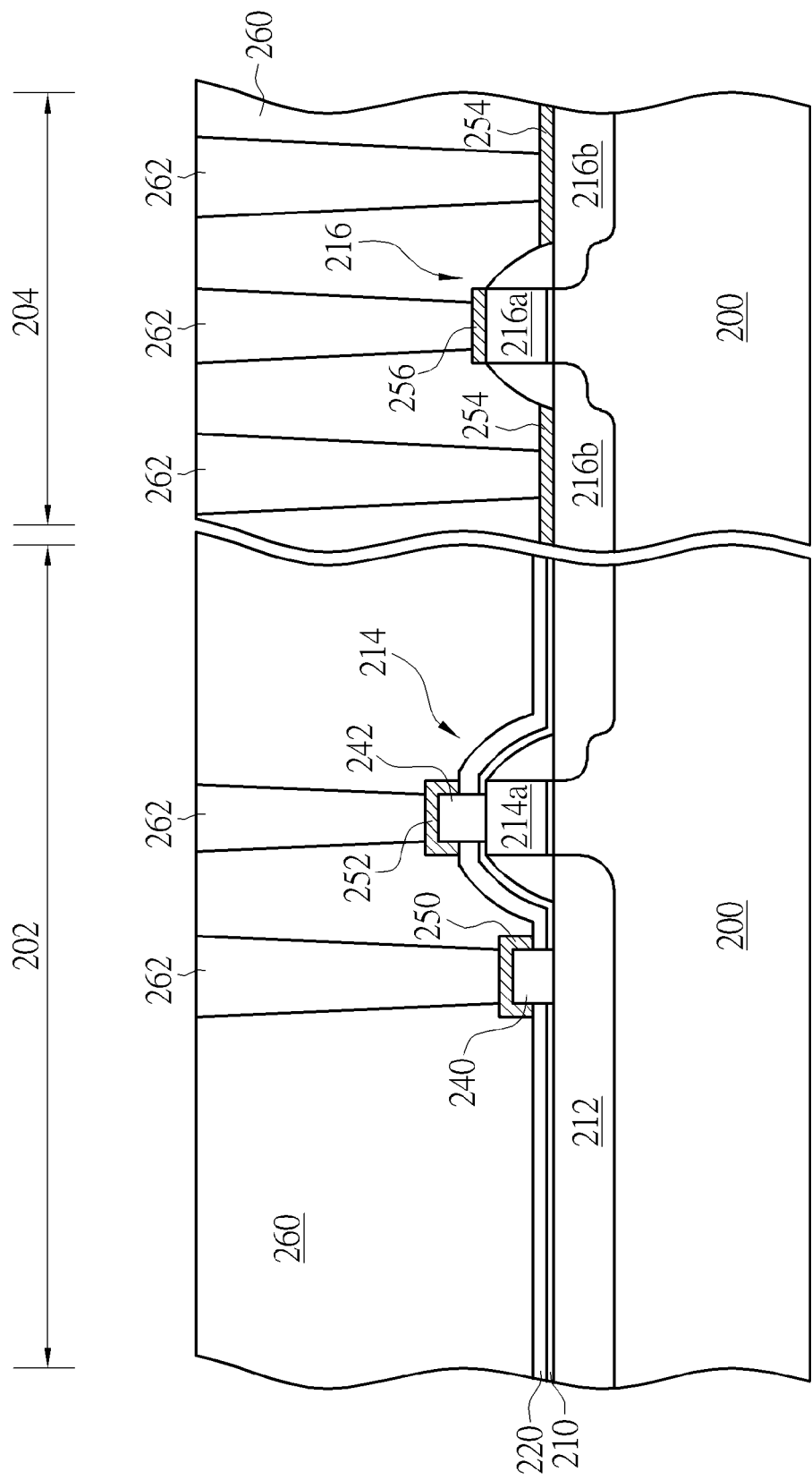

Please refer to FIG. 11. After forming the first salicide layer 250, the second salicide layer 252, the third salicide layer 254, and the fourth salicide layer 256, an ILD layer 260 is formed on the substrate 200 and followed by forming a plurality of contact plugs 262 in the ILD layer 260. As shown in FIG. 11, the contact plugs 262 are electrically connected to the first salicide layer 250, the second salicide layer 252, the third salicide layer 254, and the fourth salicide layer 256 for providing signal transmission.

According to the semiconductor device and the manufacturing method provided by the preferred embodiment, the first conductive body 240 and the second conductive body 242 having the surface respectively higher than the substrate 200 and the gate electrode 214a are formed in the pixel region 202 and thus the first salicide layer 250 and the second salicide layer 252 formed on the first conductive body 240 and the second conductive body 242 are away from and not directly contact the substrate 200, particularly from the photosensitive element 212. Consequently, metal contamination in the pixel region 202 is efficaciously avoided in the salicide process. More important, since the first salicide layer 250 and the second salicide layer 252 are allowed in the pixel region 202, contact resistances in the pixel region 202 is efficaciously reduced and thus signal transmission is improved. Additionally, because the first salicide layer 250, the second salicide layer 252, the third salicide layer 254, and the fourth salicide layer 256 are simultaneously formed, the preferred embodiment further provides the manufacturing method without increasing process complexity and process difficulty.

Summarily speaking, according to the manufacturing method of the semiconductor device provided by the present invention, the conductive bodies having a top surface higher than the substrate are formed in the pixel region, and the salicide layers are formed on the conductive bodies. Therefore, the salicide layer is formed away from the substrate, which includes the photosensitive elements. Consequently, metal contamination is avoided in the pixel region. More important, since salicide layers are allowed in the pixel region, contact resistances in the pixel region is efficaciously reduced and thus signal transmission is improved. Briefly speaking, the manufacturing method of semiconductor devices provide by the present invention is to form salicide layer, which is able to improve electrical performance of the CMOS image sensor, in the pixel region without causing metal contamination and increasing process complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary metal-oxide-semiconductor (CMOS) image sensor comprising:
   a substrate having a pixel region and a periphery region defined thereon;
   a plurality of photosensitive elements formed in the pixel region;
   a first transistor positioned in the pixel region and electrically connected to one of the plurality of photosensitive elements;
   a second transistor positioned in the periphery region, and the second transistor comprising a gate electrode and a source/drain;
   a first conductive body positioned on the substrate in the pixel region, a top surface of the first conductive body is higher than a surface of the substrate, the first conductive body contacts the one of the plurality of photosensitive elements and protrudes from a surface of the one of the plurality of photosensitive elements;
   a first salicide layer formed on the first conductive body, the first salicide layer comprising an inverted-U shape, the first salicide layer being spaced apart from the one of the plurality of photosensitive elements by the first conductive body;
   a second salicide layer formed on the source/drain of the second transistor in the periphery region, and the second salicide layer directly contacting the source/drain of the second transistor; and
   at least a contact plug formed on and electrically connected to the first salicide, wherein a surface of the contact plug which is in direct contact with a top surface of the first silicide layer has a width less than a width of the first salicide layer, and the first salicide layer and the first conductive body being sandwiched in between the contact plug and the one of the plurality of photosensitive elements in the substrate.

2. The CMOS image sensor according to claim 1, wherein the first transistor further comprises:
   a second conductive body positioned on a gate electrode of the first transistor; and
   a third salicide layer formed on the second conductive body, the third salicide layer comprising an inverted-U shape.

3. The CMOS image sensor according to claim 2, wherein the first conductive body, the second conductive body, and the gate electrode of the first transistor comprise a same material.

4. The CMOS image sensor according to claim 2, wherein the first conductive body and the second conductive body comprise a material different from the gate electrode of the first transistor.

5. The CMOS image sensor according to claim 2, further comprising:
   a fourth salicide layer formed on the gate electrode of the second transistor.

6. The CMOS image sensor according to claim 5, wherein the first salicide layer, the second salicide layer, the third salicide layer, and the fourth salicide layer are all non-coplanar.

7. The CMOS image sensor according to claim 6, wherein a topmost surface of the first salicide layer is higher than a surface of the second salicide layer.

8. The CMOS image sensor according to claim 6, wherein a topmost surface of the third salicide layer is higher than a surface of the fourth salicide layer.

* * * * *